(12) United States Patent
Kito et al.

(10) Patent No.: US 8,547,559 B2
(45) Date of Patent: Oct. 1, 2013

(54) DETECTION METHOD AND DETECTION APPARATUS

(75) Inventors: Yoshiaki Kito, Kamakura (JP); Masanori Arai, Kawasaki (JP); Tatsuo Fukui, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/568,897

(22) Filed: Aug. 7, 2012

(65) Prior Publication Data

US 2013/0033712 A1    Feb. 7, 2013

Related U.S. Application Data

(63) Continuation of application No. PCT/JP2011/000700, filed on Feb. 8, 2011.

(30) Foreign Application Priority Data

Feb. 8, 2010    (JP) ................................. 2010-025935

(51) Int. Cl.
    *G02B 13/14*    (2006.01)
(52) U.S. Cl.
    USPC ........................................................ 356/614
(58) Field of Classification Search
    USPC ........................................................ 356/614
    See application file for complete search history.

(56) References Cited

U.S. PATENT DOCUMENTS

| | | | |
|---|---|---|---|
| 6,452,503 B1 * | 9/2002 | Weiss | 340/673 |
| 2002/0025652 A1 | 2/2002 | Yanagita et al. | |
| 2004/0067621 A1 * | 4/2004 | Yanagita et al. | 438/455 |
| 2008/0319559 A1 * | 12/2008 | De Ridder et al. | 700/56 |

FOREIGN PATENT DOCUMENTS

| | | |
|---|---|---|
| JP | 5-332719 | 12/1993 |
| JP | 2001-006998 | 1/2001 |
| JP | 2002-50749 | 2/2002 |
| JP | 2006-220425 | 8/2006 |
| JP | 2009-139285 | 6/2009 |
| JP | 2009-231671 | 10/2009 |

OTHER PUBLICATIONS

International Preliminary Report on Patentability from the International Bureau of WIPO for International Application No. PCT/JP2011/000700 dated Sep. 18, 2012.
Written Opinion of the International Searching Authority for International Application No. PCT/JP2011/000700 mailed May 10, 2011.

* cited by examiner

*Primary Examiner* — Tu Nguyen
(74) *Attorney, Agent, or Firm* — Finnegan, Henderson, Farabow, Garrett & Dunner, L.L.P.

(57) ABSTRACT

A detection method of detecting a position of an uppermost substrate of a plurality of substrates stacked on each other includes applying illumination to a region covering a portion of an edge of the uppermost substrate and a portion of a lower substrate stacked with the uppermost substrate, identifying a position of the edge of the uppermost substrate based on a position of a step-like portion present in the region due to a step formed between the uppermost substrate and the lower substrate, and identifying a position of the uppermost substrate based on the position of the edge of the uppermost substrate.

20 Claims, 14 Drawing Sheets

DETECTION METHOD AND DETECTION APPARATUS

This application is a continuation of Patent Application Serial No. PCT/JP2011/000700, and claims priority to Patent Application Serial No. 2010-025935, the contents of each of which are hereby incorporated by reference, in their entirety.

BACKGROUND

1. Technical Field

The present invention relates to a detection method and a detection apparatus.

2. Related Art

Of a particular interest is a layered semiconductor device in which a plurality of substrates with electronic circuits formed thereon are stacked on each other in order to provide increased mount density for the semiconductor device. To stack a plurality of substrates on each other, a substrate bonding apparatus may be used to align and bond the substrates (see, for example, Japanese Patent Application Publication No. 2009-231671).

To stack a plurality of substrates on each other, the substrates may be appropriately positioned by referring to the outlines of the respective substrates. In this case, the outlines are detected by means of a transmissive optical system. However, when such an optical system is used to detect the outline of a layered substrate having a plurality of substrates stacked on each other and, in particular, the upper substrate is smaller in outline than the lower substrate, it is difficult to detect an accurate outline of the upper substrate.

SUMMARY

Therefore, it is an object of an aspect of the innovations herein to provide a detection method and a detection apparatus, which are capable of overcoming the above drawbacks accompanying the related art. The above and other objects can be achieved by combinations described in the claims. A first aspect of the innovations may include a detection method of detecting a position of an uppermost substrate of a plurality of substrates stacked on each other. The detection method includes applying illumination to a region covering a portion of an edge of the uppermost substrate and a portion of a lower substrate stacked with the uppermost substrate, identifying a position of the edge of the uppermost substrate based on a position of a step-like portion present in the region due to a step formed between the uppermost substrate and the lower substrate, and identifying a position of the uppermost substrate based on the position of the edge of the uppermost substrate.

A second aspect of the innovations may include a detection apparatus for detecting a position of an uppermost substrate of a plurality of substrates stacked on each other. The detection apparatus includes an illuminating section that applies illumination to a region covering a portion of an edge of the uppermost substrate and a portion of a lower substrate stacked with the uppermost substrate, and a position identifying section that identifies a position of the edge of the uppermost substrate based on a position of a step-like portion present in the region due to a step formed between the uppermost substrate and the lower substrate.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments does not limit the invention according to the claims, and all the combinations of the features described in the embodiments are not necessarily essential to means provided by aspects of the invention.

Figure 1:
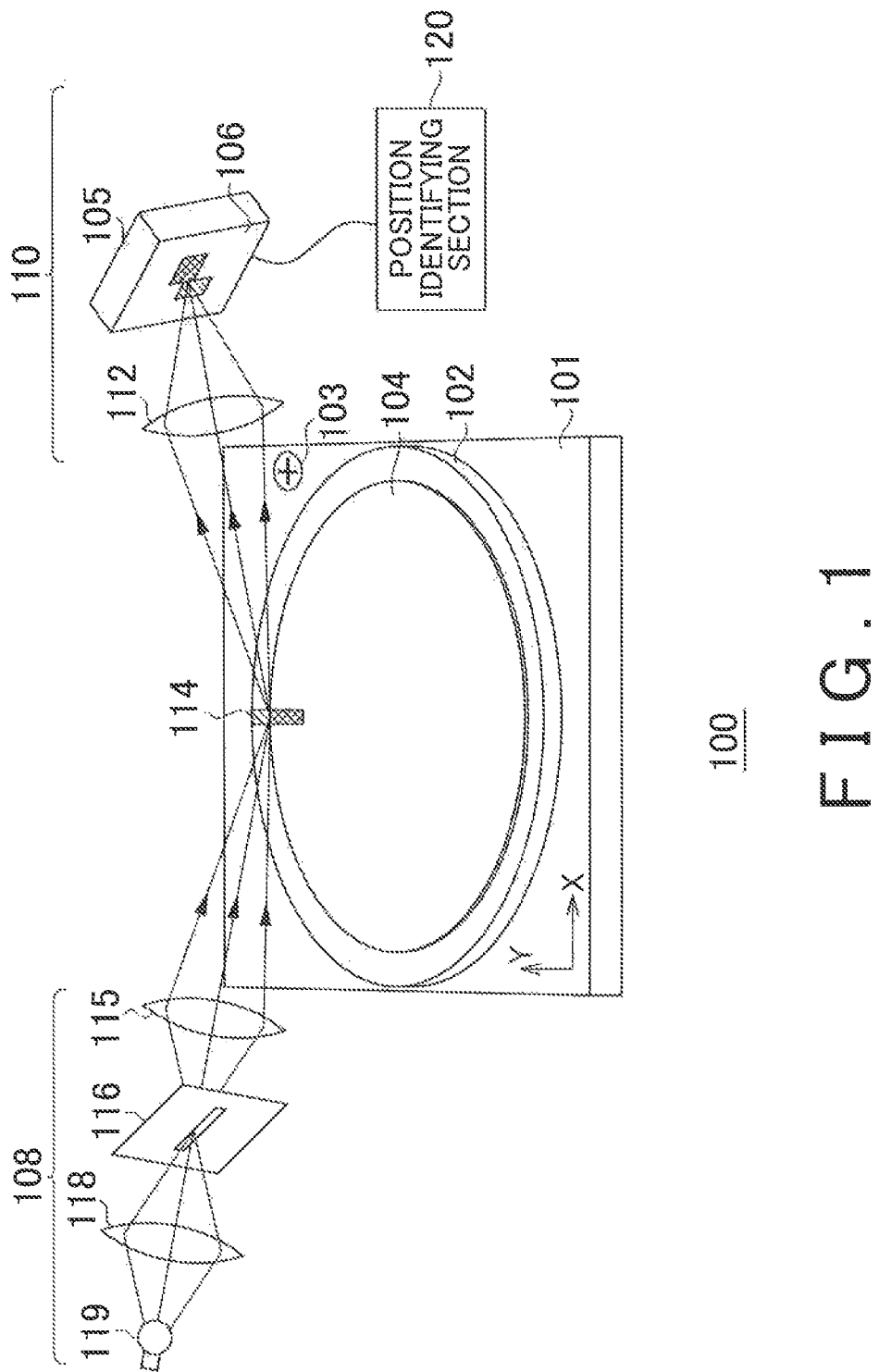
FIG. 1 is a perspective view schematically illustrating the structure of a detection apparatus 100.

FIG. 1 is a perspective view schematically illustrating the structure of a detection apparatus 100 relating to an embodiment. The detection apparatus 100 is configured to detect the position of an upper substrate 104, which is stacked on a lower substrate 102. The detection apparatus 100 includes a stage 101, an illuminating section 108, an image obtaining section 110, and a position identifying section 120.

The lower substrate 102 and the upper substrate 104 are stacked in the thickness direction by means of a substrate bonding apparatus or the like. The upper substrate 104 is smaller in outline than the lower substrate 102. Therefore, at the edge of the upper substrate 104, a step is formed between the upper surface of the upper substrate 104 and the upper surface of the lower substrate 102.

The stage 101 is configured to have the lower substrate 102 and the upper substrate 104 placed thereon for edge detection. The stage 101 is translated along the X, Y and Z axes. The stage 101 may be a stage for use in an apparatus configured to bond another substrate onto the upper substrate 104 or the like. In this case, the stage 101 may be configured to rotate with respect to the X, Y and Z axes. On the upper surface of the stage 101, a reference mark 103 is provided. In the perspective views including FIG. 1, the X and Y axes respectively extend in the left-right direction and back-forth directions within the upper surface of the stage 101. The Z axis extends upwards perpendicularly to the X and Y axes.

The reference mark 103 is used to, for example, adjust the illuminating section 108 and the image obtaining section 110. For example, prior to the task of detecting the position of a substrate, the reference mark 103 is used to bring an optical system into a focus to enable an image capturing section 105 to form a sharp image of the reference mark 103 when a slit image 114 is applied to the reference mark 103. Furthermore, the reference mark 103 is used to associate a position on the stage 101 with a position on the image captured by the image capturing section 105.

The illuminating section 108 provides the slit image 114 used to detect a position of a substrate. The illuminating section 108 includes a light source 119, a lens 118, a slit 116, and a lens 115 in the stated order.

The light source 119 emits light having a wavelength that can be detected by the image capturing section 105, for example, emits visible light when the image capturing section 105 is capable of imaging visible light. The lens 118 collects the light from the light source 119. The slit 116 delimits the illumination used to detect the position of the upper substrate 104. The lens 115 collects the light that has passed through the slit 116 to form the slit image 114 on the upper surface of the lower substrate 102 and the upper surface of the upper substrate 104.

The illuminating section 108 illuminates the lower substrate 102 and the upper substrate 104 at angle with respect to the plane orientation of the lower substrate 102 and the upper substrate 104, for example, obliquely downward from top left in FIG. 1. The slit image 114 provided by the illuminating section 108 has, on the lower substrate 102 and the upper substrate 104, an elongated shape extending in the radial direction of the disk-like lower substrate 102 and the upper substrate 104. The area illuminated by the slit image 114 covers a portion of the edge of the upper substrate 104. The illuminating section 108 stores in advance the position where the edge is expected to be positioned when the layered substrate is correctly placed at a predetermined position on the stage 101 and applies illumination to the expected position. The edge is a circumference when the lower substrate 102 and the like are shaped as a disk. The edge may have a characteristic such as a notch.

The image obtaining section 110 includes an image capturing section 105 and a lens 112. The image obtaining section 110 images a region covering a portion of the edge of the upper substrate 104 at angle with respect to the plane orientation of the upper substrate 104 and the like, obliquely downward from top right in FIG. 1. In this case, the image obtaining section 110 also stores in advance the position where the edge is expected to be positioned when the layered substrate is correctly placed at a predetermined position on the stage 101 and images a region covering the expected position.

The lens 112 focuses the light reflected from the upper surfaces of the lower substrate 102 and the upper substrate 104 onto the image capturing section 105. The examples of the image capturing section 105 include a CCD, a CMOS or the like having two-dimensionally arranged pixels. The image capturing section 105 produces an image 106 by, on the pixel basis, converting the optical signals of the image formed on the image capturing surface into electrical signals. The position identifying section 120 analyzes the image 106 and identifies the position of the edge of the upper substrate 104 based on the position of the step-like portion present in the image 106.

The optical systems of the illuminating section 108 and the image obtaining section 110 are not limited to the structures shown in FIG. 1. For example, the lenses 118, 115 and 112 only schematically represent the optical systems and each is not limited to a single lens. The optical system of the image obtaining section 110 may be a non-tilted lens optics or tilted lens optics. If a tilted lens optics is employed, the image obtaining section 110 can focus incoming light within a large region on the surfaces of the upper substrate 104 and the lower substrate 102 that are at angle with respect to the main light ray by tilting the image capturing section 105.

The following describes a detection method of detecting the position of the upper substrate 104 using the detection apparatus 100 shown in FIG. 1. The detection method includes a step of obtaining an image and a step of identifying the position. The step of obtaining an image includes a step of applying, by the illuminating section 108, illumination from top left to a region covering a portion of the edge of the upper substrate 104 to form the slit image 114, and a step of imaging, by the image capturing section 105, at angle with respect to the plane orientation of the lower substrate 102 and the upper substrate 104, the slit image 114 reflected by the upper surfaces of the lower substrate 102 and the upper substrate 104 to obtain the image 106.

Figure 2:
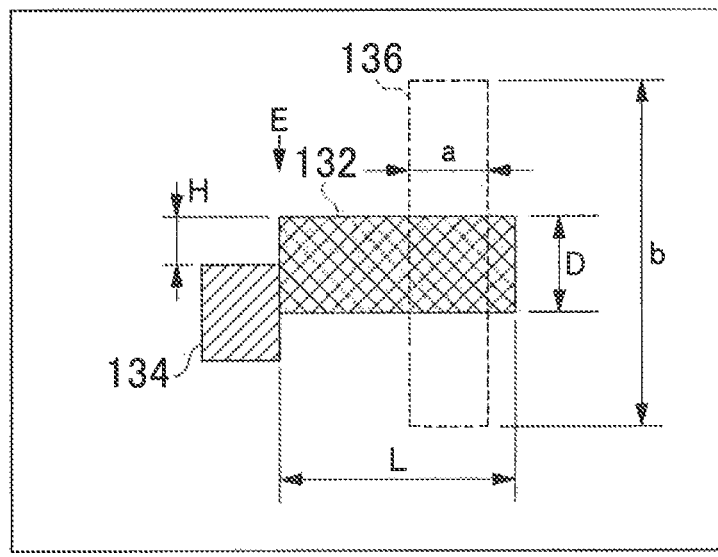
FIG. 2 is an explanatory view illustrating an image 106 of a portion of an edge of a substrate obtained by an image obtaining section.

FIG. 2 is an explanatory view illustrating the image 106 of a portion of the edge of the substrate obtained by the image obtaining section 110. In the image 106, an upper substrate reflected image 132 corresponds to a portion of the slit image 114 that is reflected by the upper substrate 104. On the other hand, a lower substrate reflected image 134 corresponds to a portion of the slit image 114 that is reflected by the lower substrate 102.

The step of identifying the position includes a step of forwarding the image 106 from the image capturing section 105 to the position identifying section 120 and a step of performing image analysis by the position identifying section 120 to identify the position of the edge of the upper substrate 104 based on the position of the step-like portion E present between the upper substrate reflected image 132 and the lower substrate reflected image 134.

The position of the step-like portion E in the image 106 corresponds to the position of the edge of the upper substrate 104. In FIG. 1, when the edge of the upper substrate 104 is moved toward the back within the region illuminated by the slit image 114, the position of the step-like portion E is moved to the left in the image 106. On the other hand, when the edge of the upper substrate 104 is moved toward the front in FIG. 1, the position of the step-like portion E is moved to the right in the image 106. Thus, the position of the edge of the upper substrate 104 can be identified by analyzing the position of the step-like portion E.

The position identifying section 120 stores thereon in advance the vertical width D of the upper substrate reflected image 132 based on the size of the slit 116, the optical magnifications of the illuminating section 108 and the image obtaining section 110, and the like. The position identifying section 120 stores thereon in advance a maximum value $L_{max}$ of the horizontal width L of the upper substrate reflected image 132 based on the size of the slit 116, the optical magnifications of the illuminating section 108 and the image obtaining section 110 and the like.

To analyze the image 106, a selection window 136 is first used to select a region of the image to be analyzed. In order to identify the upper and lower boundaries of the upper substrate reflected image 132 in the image 106, the vertical width b of the selection window 136 is preferably larger than the width D and the horizontal width a of the selection window 136 is preferably smaller than the width $L_{max}$. Since the upper substrate reflected image 132 has higher luminance than the surrounding, the position identifying section 120 can identify the upper and lower boundaries and the width D of the upper substrate reflected image 132 by analyzing the vertical luminance variation in the image selected by the selection window 136.

Figure 3:
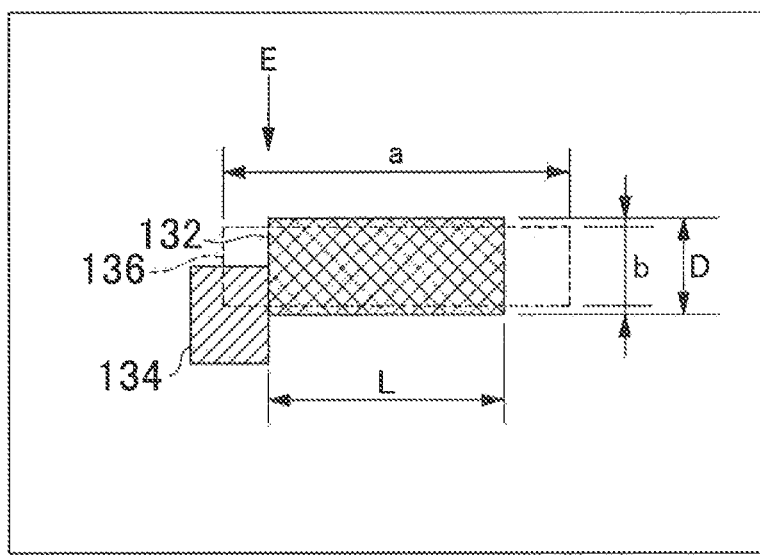
FIG. 3 illustrates how to identify the position of the portion of the edge of the substrate by means of a position identifying section.

FIG. 3 illustrates how to identify the position of the step-like portion. In order to identify the position of the step-like portion E, the horizontal width a of the selection window 136 is preferably larger than the width $L_{max}$, and the vertical width b of the selection window 136 is preferably smaller than the width D. The position identifying section 120 can identify the position of the step-like portion E by analyzing the horizontal luminance variation in the image selected by the selection window 136. The position of the step-like portion E in the image 106 can be used to identify the position, on the stage 101, the edge of the upper substrate 104 in the region illuminated by the slit image 114.

Figure 4:
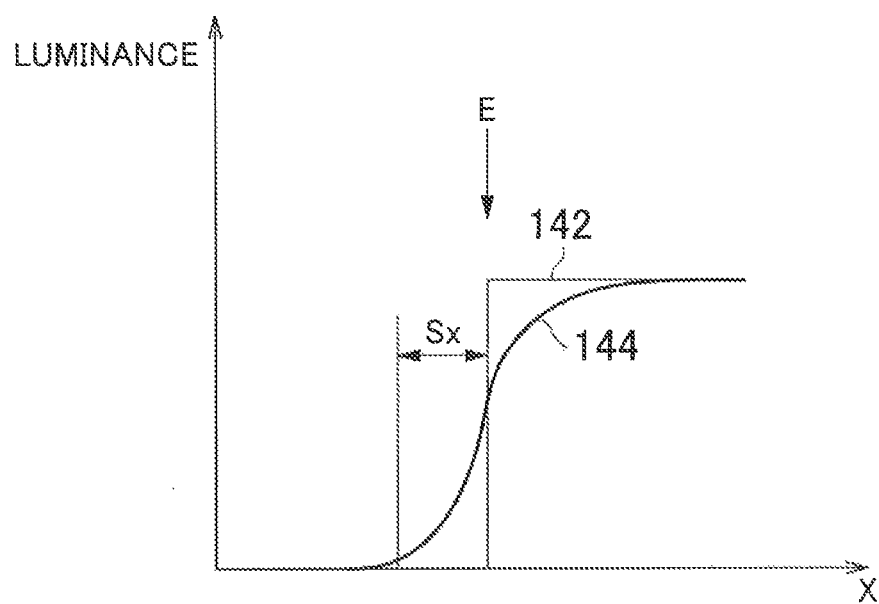
FIG. 4 shows a curve to illustrate how luminance varies at a step-like portion E.

FIG. 4 is a curve to illustrate how the luminance varies at the step-like portion F of the upper substrate reflected image 132 present in the image 106. In FIG. 4, the horizontal axis represents the horizontal coordinates in the image 106 shown in FIG. 2 and the like, and the vertical axis represents the luminance. FIG. 4 shows the luminance variation in the upper substrate reflected image 132. The upper substrate reflected image 132 is ideally expected to exhibit sharp luminance variation at the step-like portion E as indicated by a polygonal line 142. In reality, however, the luminance of the upper substrate reflected image 132 gradually varies around the step-like portion E as shown by a curve 144 due to the aberration of the optical systems and the like. Here, the half width Sx of the region in which the luminance gradually varies is referred to as a blurring amount.

The blurring amount Sx caused by the diffraction on the image capturing surface is on the order of $\beta\lambda/NA$, where $\beta$ denotes the imaging magnification ratio of the optical system, $\lambda$ denotes the wavelength of the incident light and NA denotes the numerical aperture of the lens. To accurately identify the step-like portion E, three or more measurements are preferably included within the range of the blurring amount. For example, when the image capturing section 105 is formed by using a CCD, three or more pixels are included within the range of Sx under the condition of $(\beta\lambda/NA)>3u$, where u denotes the size of the pixel of the CCD. In other words, the condition is transformed into $NA<(\beta\lambda/3u)$.

For example, when $\beta=1$, $u=5$ μm, and $\lambda=0.67$ μm, $NA<0.045$. This conditional expression for NA represents the preferable upper limit for NA when the variables $\beta$, u and $\lambda$ take the above-mentioned values. When a tilted lens optics is used, the variable $\beta$ is replaced with the lateral magnification $\beta'$ of the tilted lens optics.

Figure 5:
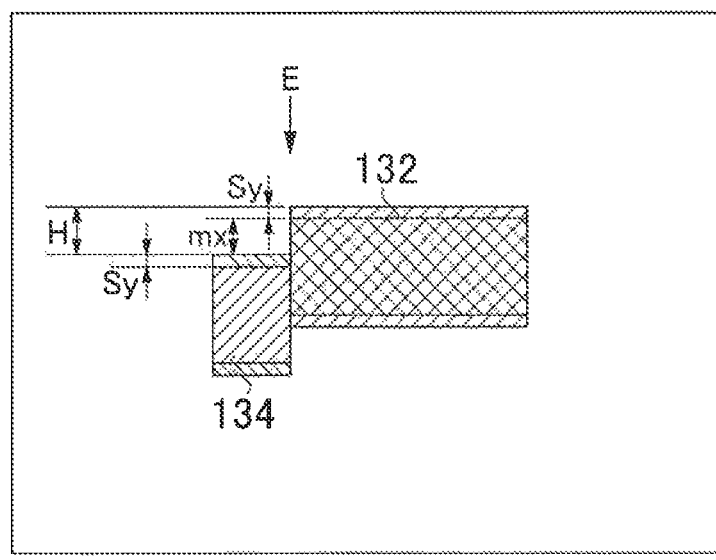
FIG. 5 is an explanatory view illustrating the detection conditions under which the detection apparatus operates.

FIG. 5 is an explanatory view illustrating other conditions. In addition to the blurring amount Sx shown in FIG. 4, there is a blurring amount Sy in the vertical direction of the upper substrate reflected image 132 and the lower substrate reflected image 134. In order to identify the step-like portion E, the height H of the step-like portion E is preferably larger than (Sy+mu), where m denotes the number of pixels used to identify the step-like portion E and thus is an integer of 1 or more. Considering that the blurring amount Sy is also on the order of $\beta\lambda/NA$, the following expression is preferably satisfied.

$$H>(\beta\lambda/NA)+mu \quad (1)$$

The height H of the step-like portion E corresponds to the interval h between the upper surface of the lower substrate 102 and the upper surface of the upper substrate 104, in other words, to the thickness of the upper substrate 104. The value of the height H is defined by the following expression.

$$H=2h\beta \sin\theta_i \quad (2)$$

Here, h denotes the distance between the upper surface of the lower substrate 102 and the upper surface of the upper substrate 104, and $\theta_i$ denotes the incident angle of the incident light. When a tilted lens optics is used, the variable $\beta$ is replaced with the lateral magnification $\beta'$ of the tilted lens optics.

When $\theta_i$ is 90°, $\sin\theta_i$ takes a maximum value of 1. Thus, the maximum value of H can be represented by the following expression.

$$H_{max}=2h\beta \quad (3)$$

By substituting Expression (3) into Expression (1), the following expression is obtained.

$$2h\beta>(\beta\lambda/NA)+mu \quad (4)$$

For example, when $\beta=1$, $u=5$ μm, $\lambda=0.67$ μm and $m=1$, the condition of $NA>0.0012$ should be satisfied in order to detect a distance h of 30 μm. This conditional expression for NA represents the preferable lower limit for NA when the variables $\beta$, u, $\lambda$ and m take the above-mentioned values.

In order to more accurately detect the shape of the upper substrate 104, the incident plane including the incident light and the reflected light is preferably in contact with the edge of the upper substrate 104. If the incident plane is off the tangential line direction of the substrate, the detected results may contain errors. In order to reduce such errors to fall within the acceptable range, the angle formed between the incident plane and the tangential line direction of the upper substrate 104 is preferably adjusted to be 5° or less.

Figure 6:
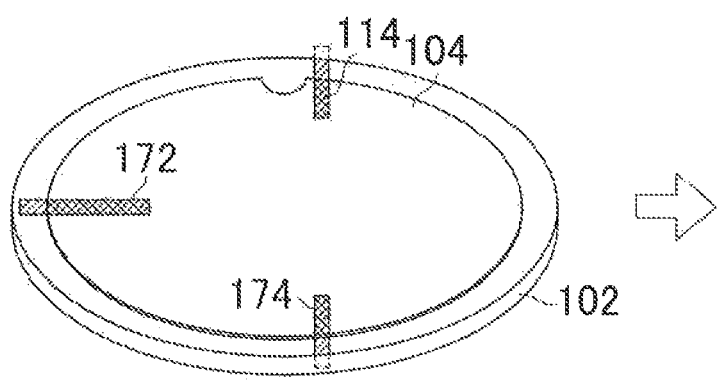
FIG. 6 is an explanatory view illustrating how to obtain images of three different portions of the edge of the substrate.

FIG. 6 illustrates another embodiment of how to identify the position of the edge of the upper substrate 104. According to this embodiment, the position of the upper substrate 104 is identified by applying slit images 114, 172 and 174 to three different portions on the edge of the upper substrate 104 and obtaining images formed by the reflections from the respective portions. In this case, detection apparatuses 100 corresponding to the slit images 114, 172 and 174 are provided. Each of the detection apparatuses 100 can identify the position of the edge of a corresponding one of the portions in accordance with the above-described detection method.

In this embodiment, provided that the shape of the upper substrate 104 is known in advance, the position of the upper substrate 104 on the stage 101 can be more accurately detected by identifying the positions of three different portions of the edge of the upper substrate 104 in the image 106. For example, if the upper substrate 104 is shaped like a disk, the position of the center of the upper substrate 104 and the radius of the upper substrate 104 can be identified by identifying the positions of three different portions of the edge of the upper substrate 104. Thus, the position of the upper substrate 104 can be accurately detected. This embodiment can not only achieve highly efficient detection but also reduce the errors that may occur when a plurality of portions of a substrate are detected by moving the substrate.

Figure 7:
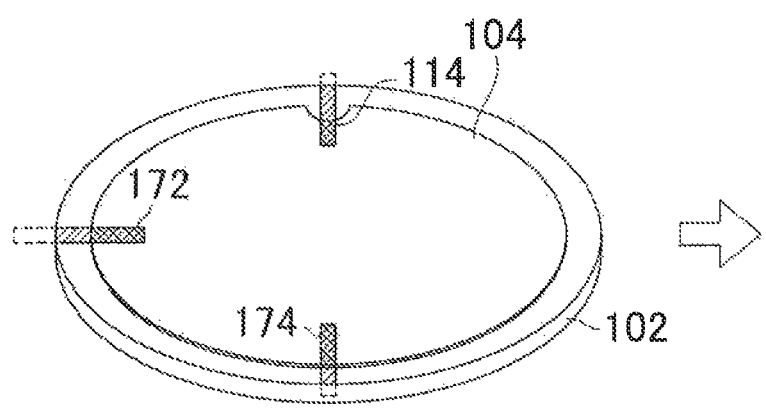
FIG. 7 is an explanatory view illustrating how to obtain images while moving substrates.
Figure 8:
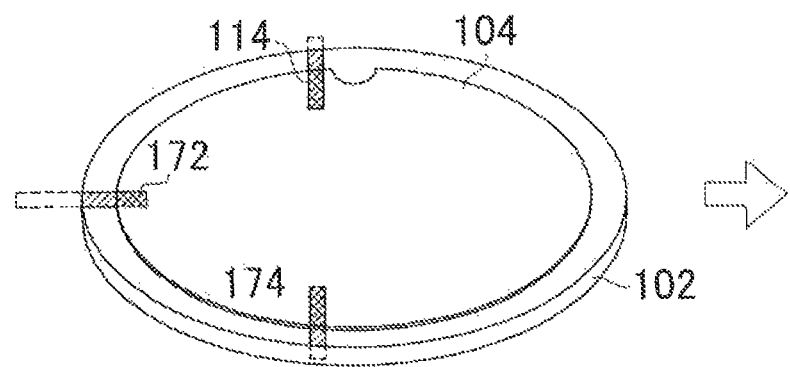
FIG. 8 is an explanatory view illustrating how to obtain images while moving substrates.

FIGS. 7 and 8 illustrate further different embodiments of identifying the position of the edge of the upper substrate 104. FIGS. 7 and 8 illustrate operations performed after the operation shown in FIG. 6. According to this embodiment, the upper substrate 104 and the like are moved relative to the regions to be imaged and the illumination to be applied to the upper substrate 104 and the like, in order to obtain images of a plurality of portions and identify a characteristic such as a notch.

In this case, as shown in FIG. 7, the slit image 114 illuminates the region that includes the notch of the upper substrate 104, the slit image 172 illuminates the position 90 degrees rotated away from the notch, and the slit image 174 illuminates the position 180 degrees rotated away from the notch. The slit images 114, 172 and 174 provide elongated illumination extending in the radial direction of the upper substrate 104 at their respective positions. Each of the detection apparatuses 100 obtains an image of a corresponding one of the regions and identifies the position of a corresponding portion of the edge. As shown in FIG. 7, the identification of the notch of the upper substrate 104 can identify how much the upper substrate 104 has rotated.

In FIGS. 6 to 8, the slit images 114 and 174 longitudinally extend in the Y axis and the slit image 172 longitudinally extents in the X axis. In this case, the incident plane of the slit image 114 or 174 is vertical to the Y axis. The incident plane of the slit image 172 is vertical to the X axis.

In FIGS. 7 and 8, the stage 101 is moved in the X direction, or to the right in FIGS. 7 and 8, from the position of the upper substrate 104 and the like shown in FIG. 6, as a result of which the upper substrate 104 and the lower substrate 102 are moved and a plurality of different portions of the edge are thus detected. In this case, the image obtaining section 110 captures a plurality of images 106, while the illuminating section 108 and the image obtaining section 110 remains stationary and the stage 101 is moved at a constant rate. Here, the stage 101 may be moved intermittently and the images 106 may be obtained while the stage 101 is temporarily stationary.

Figure 9:
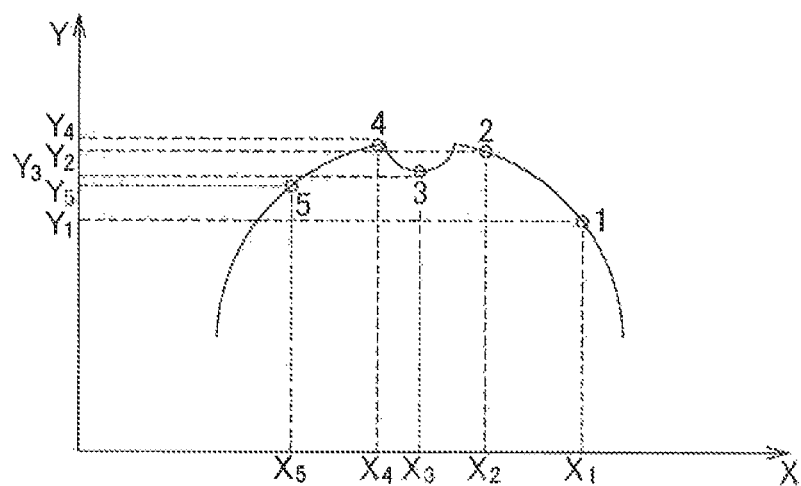
FIG. 9 is an explanatory view illustrating how to judge the outline and position of a substrate based on the detected position of the edge of the substrate.

FIG. 9 illustrates, as an example, the information about the plurality of different portions of the edge that is obtained by the embodiment shown in FIGS. 6 to 8. FIG. 9 shows the position (Y1, Y2, . . . ) of the step-like portion in the image 106 corresponding to the slit image 114 in FIGS. 6 to 8 and the associated position (X1, X2, . . . ) on the X axis of the stage 101. Based on the shown information, the position of the notch on the stage 101 can be identified in the X and Y axes.

The method in which a plurality of portions of the edge are identified by moving the upper substrate 104 and the like is not limited to the case shown in FIGS. 6 to 8 where three slit images are applied to the layered substrate, in other words, the case where the three detection apparatuses 100 are used to identify three different points on the layered substrate. This method is applicable to a case where a single point is identified as shown in FIG. 1, and to a case where more or less than three points are identified. In the case where a single point is identified, the position and shape of the upper substrate 104 can be detected by moving the upper substrate 104 and the like to identify a plurality of portions of the edge.

When the stage 101 is moved, vibration and the like may occur and change the relative positions of the stage 101 and the image capturing section 105 during the movement. This may lead to erroneously identified positions. When a plurality of portions are identified as shown in FIGS. 6 to 8, on the other hand, the detection apparatuses 100 associated with the slit images 114 and 174 detect the variation in position resulting from the vibration in the Y axis. The detected variation in position resulting from the vibration in the Y axis is used to correct the value in the Y axis included in the position information identified by using the slit image 172. Similarly, the detection apparatus 100 associated with the slit image 172 detects the variation in position resulting from the vibration in the X axis. The detected variation in position resulting from the vibration in the X axis is used to correct the value in the X axis included in the position information identified by using the slit images 114 and 174. Such correction enables the shape and position of the upper substrate 104 to be more accurately detected.

Figure 10:
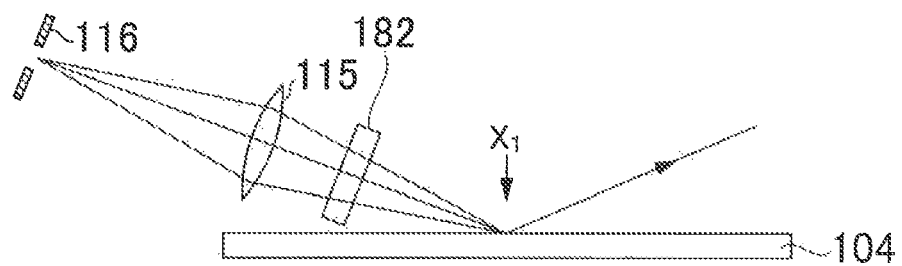
FIG. 10 is a front view illustrating an embodiment of scanning incident light.
Figure 11:
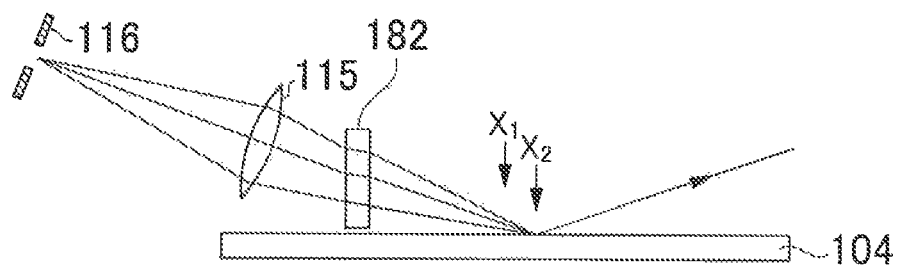
FIG. 11 is a front view illustrating the embodiment of scanning incident light.

FIGS. 10 and 11 are front views to illustrate an embodiment of scanning the illumination. According to the embodiment shown in FIGS. 10 and 11, a plurality of portions of the edge are detected by moving the illumination to illuminate different regions, instead of moving the stage 101.

As shown in FIG. 10, the illuminating section 108 has a parallel plate glass 182 on the side of the image with respect to the lens 115, in other words, between the lens 115 and the layered substrate. Since the entrance surface of the parallel plate glass 182 is oriented vertical to the principal light ray in FIG. 10, the illumination is applied to the position $x_1$ after transmitting through the parallel plate glass 182. Here, the position $x_1$ is on the extended line from the center of the lens in the direction of the principal light ray.

As shown in FIG. 11, if the parallel plate glass 182 is tilted at angle with respect to the principal light ray through the lens, the position to which the illumination is applied can be moved from $x_1$ to $x_2$ without changing the angle at which the illumination is incident on the layered substrate. In this way, a plurality of portions of the edge can be detected by changing the angle of the parallel plate glass 182 to scan the layered substrate with the illumination.

Figure 12:
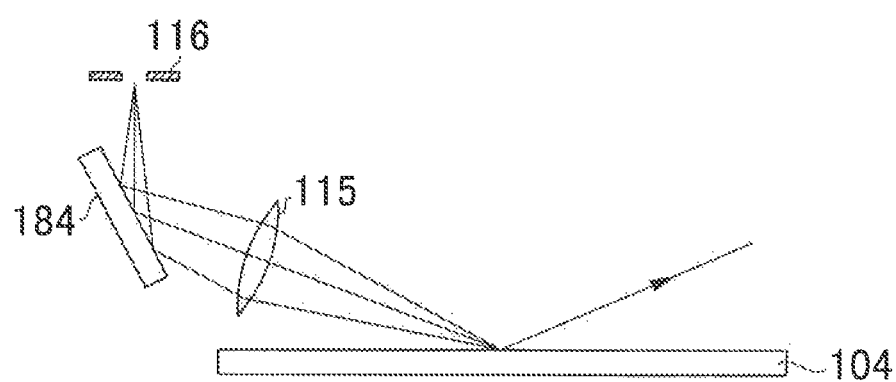
FIG. 12 is a front view illustrating another embodiment of scanning incident light.

FIG. 12 is a front view illustrating another embodiment of scanning the illumination. In FIG. 12, the illuminating section 108 has a mirror 184 at the position of the pupil. The slit image 114 can be applied to different positions by changing the angle of the mirror 184.

According to the embodiments shown in FIGS. 10 to 12, it is not necessary to move the stage 101 having the layered substrate placed thereon. As a result, the detection apparatus 100 as a whole can be made more compact.

In order to more accurately detect the shape of the upper substrate 104, the incident plane including the incident light and the reflected light is preferably in contact with the edge of the upper substrate 104. If the stage 101 or incident light is moved within a large area, a large angle may be formed between the edge and the incident plane within the detectable region, in which case the detected result may be less accurate (see FIGS. 6 to 8). Therefore, if the measurement is performed while the stage 101 or incident light is moved, it is preferable to limit the movable range of the stage 101 or incident light. For example, when the slit 116 having a width of 0.065 mm is used to detect the edge of the upper substrate 104 having a size of approximately 300 mm, the upper substrate 104 is pre-aligned in such a manner that the notch is oriented in the Y direction with respect to the center of the substrate and then arranged on the stage 101, and the edge of the upper substrate 104 may be accurately detected while the stage 101 or incident light is moved within 5 mm or less.

Figure 13:
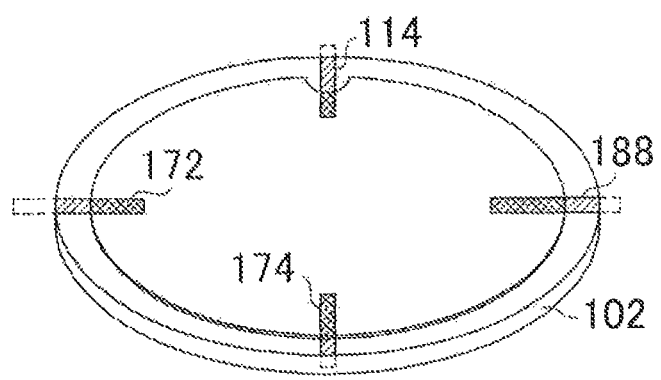
FIG. 13 is an explanatory view illustrating how to obtain images of four different portions of the edge of the substrate.

FIG. 13 illustrates an embodiment of identifying four different portions. In addition to the slit images 114, 172 and 174 shown in FIG. 6, a slit image 188 is additionally provided that is applied to the position 180 degrees rotated away from the slit image 172. In this way, four different portions of the edge can be identified simultaneously. In this case, if one of the four slit images is applied to the position of the notch of the upper substrate 104, the other three slit images can be used to simultaneously detect the position of the center of the upper substrate 104.

Figure 14:
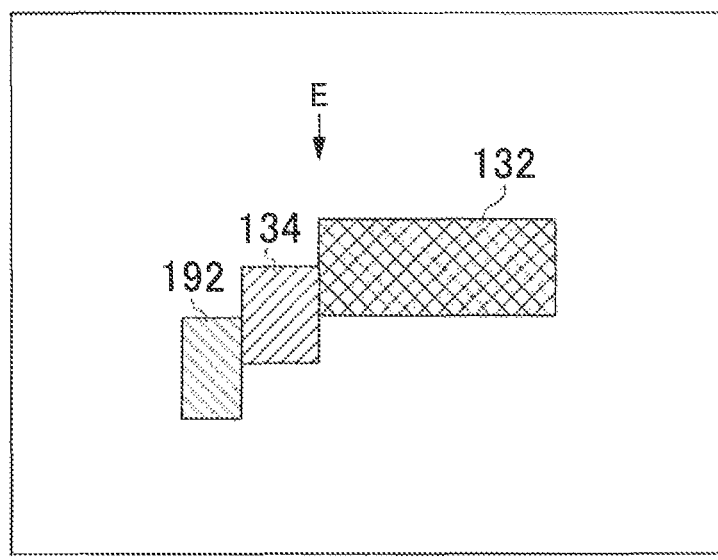
FIG. 14 is an explanatory view showing an image of a portion of edges of substrates of a three-layered substrate.

FIG. 14 is an explanatory view showing an image of a portion of edges of substrates that can be obtained by means of the detection apparatus 100 shown in FIG. 1 when three substrates with different sizes are stacked on each other. For example, when a substrate larger than the lower substrate 102 is placed under the lower substrate 102 in FIG. 1, the three substrates produce, in the image 106, the upper substrate reflected image 132, the lower substrate reflected image 134 and a three-layered substrate reflected image 192 from the above. In this case, the above-described method can be used to detect the position of the edge of the uppermost upper substrate 104 as long as a sufficiently distinguishable step-like portion E is present in association with the edge of the upper substrate 104 in the upper substrate reflected image 132.

As is apparent from the above, the present embodiment enables an apparatus configured to manufacture a layered semiconductor apparatus by bonding a plurality of substrates together to accurately detect the outlines and positions of the substrates to be bonded together. In this way, the substrates to be bonded together can be accurately aligned with each other.

In the above-described embodiment, the image obtaining section 110 is positioned to obtain an image formed by the specular reflection of the illumination applied at angle by the illuminating section 108. However, the arrangement of the illuminating section 108 and the image obtaining section 110 is not limited to such. As an alternative example, the illuminating section 108 may be at angle with respect to the plane of the substrate, and the image obtaining section 110 may obtain an image in the normal direction of the plane orientation of the substrate. As a further alternative example, the illuminating section 108 may apply the illumination in the normal direction to the plane of the substrate, and the image obtaining section 110 may obtain an image at angle with respect to the plane orientation of the substrate. As a yet further alternative example, the illuminating section 108 and the image obtaining section 110 may be both positioned at angle with respect to the plane of the substrate and off the specular reflection.

In the above-described embodiment, the slit image 114 is used as the illumination. However, the examples of the illumination are not limited to such. As an alternative, the negative-positive relation between the slit image 114 and the surrounding may be reversed. In other words, the illumination may be designed to have a slit-like shade surrounded by light. In this case, the illumination is preferably patterned to extend in the radial direction of the substrate when the substrate is circular.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A method comprising:
applying illumination to a region covering a portion of an edge of an uppermost substrate and a portion of a lower substrate stacked with the uppermost substrate;
identifying a position of the edge of the uppermost substrate based on a position of a step-like portion present in the region due to a step formed between the uppermost substrate and the lower substrate; and
identifying a position of the uppermost substrate based on the position of the edge of the uppermost substrate;
wherein at least one of the application of illumination and the position identification is performed at an obliquely downward angle with respect to a plane orientation of the lower substrate.

2. The method as set forth in claim 1, further comprising obtaining at least one of an upper reflection image formed by reflection from the uppermost substrate and a lower reflection image formed by reflection from the lower substrate, wherein
in the identifying the position of the edge of the uppermost substrate, the step-like portion is identified based on one of the upper reflection image and the lower reflection image.

3. The method as set forth in claim 2, wherein
the identifying the position of the edge of the uppermost substrate includes detecting the step-like portion based on a difference in luminance between the upper reflection image and the lower reflection image.

4. The method as set forth in claim 2, wherein
the obtaining includes obtaining an image formed by specular reflection from the region to which the illumination is applied in the applying.

5. The method as set forth in claim 2, further comprising moving the plurality of substrates in a direction intersecting a radial direction of the uppermost substrate, when the uppermost substrate is circular, wherein
the obtaining includes obtaining images of the region, at a plurality of positions of the uppermost substrate that are created by the movement of the substrates, and
the identifying the position of the uppermost substrate includes detecting a position of a characteristic included in the edge based on the position of the step-like portion in the images obtained at the plurality of positions of the uppermost substrate.

6. The method as set forth in claim 2, wherein
when the edge of the uppermost substrate includes a notch, the obtaining includes imaging a plurality of regions of the uppermost substrate, and
the identifying the position of the uppermost substrate includes identifying a rotating direction of the notch based on one of the plurality of regions including the notch.

7. The detection method as set forth in claim 6, further comprising
moving the plurality of substrates in a direction intersecting the radial direction, wherein
the obtaining includes obtaining images of the one of the plurality of regions including the notch at a plurality of positions of the uppermost substrate created by the movement of the substrates, and
the identifying the position of the edge includes detecting a position of a characteristic included in the notch based on the position of the step-like portion of the images obtained at the plurality of positions of the uppermost substrate.

8. The method as set forth in claim 7,
comprising
correcting the position of the characteristic included in the notch, based on a variation in the position of the edge among the images of the plurality of regions that are obtained at the plurality of positions which do not include the notch.

9. The method as set forth in claim 6, wherein
the applying includes scanning the illumination in a direction intersecting the radial direction, and
the identifying the position of the uppermost substrate includes identifying a position of a characteristic included in the notch based on the position of the step-like portion in the images obtained at the plurality of positions of the illumination.

10. The method as set forth in claim 6, wherein
the obtaining includes obtaining the one of the plurality of regions at a position 90 degrees rotated away from the notch when the uppermost substrate is circular.

11. The method as set forth in claim 6, wherein
the obtaining includes obtaining the one of the plurality of regions at a position 180 degrees rotated away from the notch when the uppermost substrate is circular.

12. The method as set forth in claim 2, wherein the obtaining includes using a tilted lens optic.

13. The method as set forth in claim 1, wherein
the applying includes forming a plane by incident light and reflected light of the illumination that intersects a radial direction of the uppermost substrate, when the uppermost substrate is circular.

14. The method as set forth in claim 1, wherein
the applying includes patterning the illumination to extend in a radial direction of the uppermost substrate, when the uppermost substrate is circular.

15. The method as set forth in claim 14, wherein
the applying includes scanning the illumination in a direction intersecting the radial direction,
the obtaining includes obtaining images of the region at a plurality of positions of the illumination created by the scanning of the illumination, and
the identifying the position of the uppermost substrate includes identifying a position of a characteristic included in the edge based on the position of the step-like portion in the images obtained at the plurality of positions of the illumination.

16. An apparatus comprising:
an illuminating section that applies illumination to a region covering a portion of an edge of an uppermost substrate and a portion of a lower substrate stacked with the uppermost substrate; and
a position identifying section that identifies a position of the edge of the uppermost substrate based on a position of a step-like portion present in the region due to a step formed between the uppermost substrate and the lower substrate;
wherein at least one of the application of illumination and the position identification is performed at an obliquely downward angle with respect to a plane orientation of the lower substrate.

17. The apparatus as set forth in claim 16, further comprising
an image obtaining section that obtains at least one of an upper reflection image formed by reflection from the uppermost substrate and a lower reflection image formed by reflection from the lower substrate, wherein
the position identifying section identifies the step-like portion based on one of the upper reflection image and the lower reflection image.

18. The apparatus as set forth in claim 17, wherein
the position identifying section detects the step-like portion based on a difference in luminance between the upper reflection image and the lower reflection image.

19. The apparatus as set forth in claim 17, further comprising
a plurality of the illuminating sections operable to apply illumination to a plurality of regions of the uppermost substrate;
and a plurality of the image obtaining sections in correspondence with the plurality of illuminating sections.

20. The apparatus as set forth in claim 16, wherein
the illuminating section applies the illumination in such a manner that a plane formed by incident light and reflected light of the illumination intersects a radial direction of the uppermost substrate, when the uppermost substrate is circular.

* * * * *